United States Patent [19]

Takahashi et al.

[11] Patent Number: 5,499,190
[45] Date of Patent: Mar. 12, 1996

[54] SYSTEM FOR MEASURING TIMING RELATIONSHIP BETWEEN TWO SIGNALS

[75] Inventors: Hironori Takahashi; Tsuneyuki Urakami; Shinichiro Aoshima; Isuke Hirano, both of Hamamatsu, Japan

[73] Assignee: Hamamatsu Photonics K.K., Hamamatsu, Japan

[21] Appl. No.: 5,091

[22] Filed: Jan. 15, 1993

[30] Foreign Application Priority Data

Jan. 16, 1992 [JP] Japan ................................. 4-005880
Dec. 25, 1992 [JP] Japan ................................. 4-346819

[51] Int. Cl.⁶ ................................................. G04F 13/02
[52] U.S. Cl. ........................... 364/481; 324/621; 364/569; 371/1
[58] Field of Search ................................. 324/621, 622; 364/480, 481, 486, 569, 579; 371/1

[56] References Cited

U.S. PATENT DOCUMENTS

| | | | |
|---|---|---|---|
| 2,700,133 | 1/1955 | Pfleger | 324/621 |
| 2,768,348 | 10/1956 | Grumet et al. | 368/117 |
| 2,915,700 | 12/1959 | Cartwright | 324/621 |
| 3,157,781 | 11/1964 | Gruen | 364/819 |
| 4,703,448 | 10/1987 | Muething | 364/481 |
| 4,802,486 | 2/1989 | Goodman et al. | 128/633 |
| 4,911,167 | 3/1990 | Corenman et al. | 128/633 |
| 4,928,692 | 5/1990 | Goodman et al. | 128/633 |
| 4,934,372 | 6/1990 | Corenman et al. | 128/633 |

FOREIGN PATENT DOCUMENTS

| | | |
|---|---|---|
| 0297562 | 1/1989 | European Pat. Off. |
| 0460696 | 12/1991 | European Pat. Off. |
| 0492677 | 7/1992 | European Pat. Off. |
| 0501722 | 9/1992 | European Pat. Off. |
| 3807438 | 9/1989 | Germany |
| 55-122170 | 9/1980 | Japan |
| 58-46735 | 3/1983 | Japan |
| 63-261178 | 10/1988 | Japan |
| 63-289468 | 11/1988 | Japan |

OTHER PUBLICATIONS

Webb, On–Wafer Optoelectronic Characterization of Monolithic Millimeter–Wave Integrated Circuits, Electro, Conf. Record, vol. 14, No. 13/1, Apr. 1989, Los Angeles, pp. 1–6.

Aoshima et al., Non–Contact Picosecond Electro–Optic Sampling with a Semiconductor Laser, T.IEE Japan, vol. 111–C No. 4, 1991, pp. 145–154.

Aoshima et al., Non-contact electro–optic sampling utilizing semiconductor laser pulses, Reprinted from Ultrahigh Speed and High Speed Photography, Photonics, and Videography '89, SPIE/The International Society for Optical Engineering, vol. 1155, Aug. 7–9, 1989, San Diego, California, pp. 499–510.

Valdmanis et al., Subpicosecond Electrooptic Sampling: Principles and Applications, IEEE Journal of Quantum Electronics, vol. QE–22, No. 1, Jan. 1986, pp. 69–78.

*Primary Examiner*—Edward R. Cosimano
*Attorney, Agent, or Firm*—Cushman Darby & Cushman

[57] ABSTRACT

A system for measuring timing relationship between two signals for accurately measuring a timing relationship between signals includes an electro-optic measuring unit and a waveform storage and processing unit. The electro-optic measuring unit samples electrical signals from a device under measurement via a strobe light so as to measure the signal waveform. The electro-optic unit uses a laser diode as a light source. The waveform storage and processing unit stores the electrical signal waveforms measured by the electro-optic measuring unit in digital form. The waveform storage and processing unit also calculates a correlation between two stored electrical signal waveforms via a correlation calculation unit, and also detects a peak of the correlation to detect a timing relationship between the signals.

26 Claims, 11 Drawing Sheets

Fig. 9
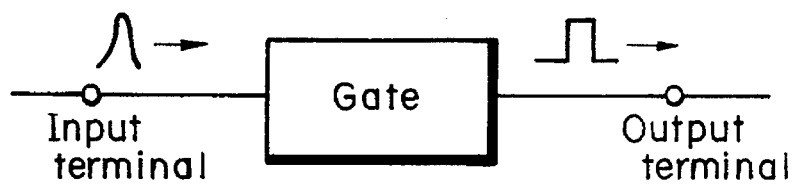
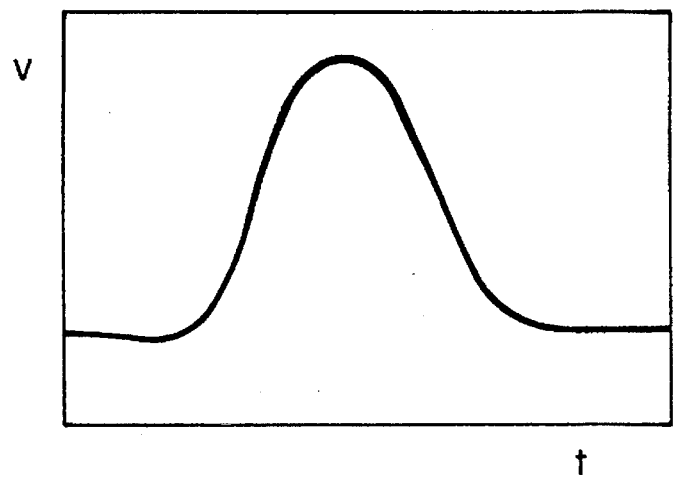
Fig. 10A
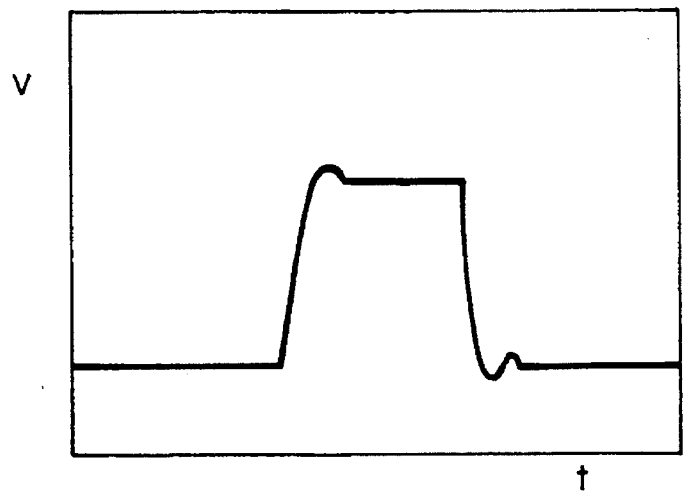
Fig. 10B

SYSTEM FOR MEASURING TIMING RELATIONSHIP BETWEEN TWO SIGNALS

BACKGROUND OF THE INVENTION

1. Field of the Invention

The present invention relates to a system for measuring timing relationship between signals such as a time difference between two signals.

2. Related Background Art

In measuring a time difference between two signals, a device for displaying a signal waveform such as an oscilloscope (including a storage oscilloscope) is usually used. This is briefly explained below. Signal waveforms are displayed on a display screen of the device and a difference on time axis on the display screen is measured to detect a timing relationship between the signal forms. For example, for signal waveforms having peaks, peak positions of the waveforms are observed to detect the time difference on the time axis.

In an IC tester, a fast rise pulse signal is applied to each pin and a delay between input and output of the signal is measured. If there is a difference between distances from a pulse signal source to the respective pins, the pulse signals at the respective pins rise with a time difference (Assuming that a velocity of an electrical signal is equal to a light velocity, there is a difference of 10 ps for 3 mm). Accordingly, it is necessary to calibrate the time difference between the pulse signals and it is usually done in the following manner. Near the pin, the pulse signal is applied to a comparator to detect a time difference between crossings of a threshold level, and the timing from the pulse signal source is adjusted to make the time difference zero. After the calibration, the same comparator is used to measure the input/output timing difference by the difference between crossings of the threshold level.

When the device for displaying the signal waveform is used, if a noise is included in the signal, a portion to be compared is made vague by the noise and it is not possible to precisely measure the time difference. Further, because of visual measurement, a visual measurement error is necessarily included. In addition, if the waveform is distorted, it is hard to specify the portion to be compared, and measurement result differs from person to person.

Similar problems are encountered when the time difference is measured by a threshold level. If the noise is included, the threshold is misdetected due to the noise, and if the waveform is distorted, the time difference between crossings of the threshold level does not always correspond to a time difference between signals.

Thus, there has been a limit in the precise measurement of the time difference between the two signals.

SUMMARY OF THE INVENTION

It is a first object of the present invention to provide means for precisely measuring a time difference between two signals with a high resolution.

It is a second object of the present invention to permit measurement without visual measurement error even if a portion to be compared is vague due to a noise.

It is a third object of the present invention to attain the above objects by an apparatus which is easy to use.

In order to solve the above problems, the system of the present invention comprises first means for measuring two or more waveforms and second means for processing the stored signal waveforms to detect a time difference between the signals.

The first means may comprise an optical system for converting an electrical field of the signal to a light signal by light modulation and detecting the light signal, and a measuring system for measuring a signal waveform from the detected electrical field of the signal.

The optical system may comprise a probe which may be arranged in the vicinity of a signal path and has an electro-optic effect, a light source for supplying a light to the probe and a detector for detecting the light light-modulated by the probe.

The light light-modulated by the probe may be reflected by the probe and detected by the detector.

The probe may comprise a crystal having an electro-optical effect, an electrode arranged in the vicinity of the crystal for establishing the electrical field between it and the signal path and a reflection film for reflecting the light from the light source.

The crystal may primarily consist of $LiNbO_3$.

The light source may be a laser light source which can emit a short pulse laser beam.

The measuring system may comprise a control circuit for driving the light source to emit a pulsive light, and a measuring unit for detecting the signal waveform by lock-in amplification by a drive timing of the drive circuit and the detection output of the detector.

The measuring system may further comprise a drive circuit for supplying a pulse to a circuit under measurement including the signal path, and the control circuit may drive the light source with a gradually offset timing to the timing of the pulse supplied by the drive circuit.

The optical system may be a two-channel system.

The optical system may comprise a first probe which can be arranged in the vicinity of one of signal paths and has an electro-optical effect, a first light source for supplying a light to the first probe, a first detector for detecting the light light-modulated by the first probe, a second probe which can be arranged in the vicinity of another signal path and has an electro-optical effect, a light source for supplying a light to the second probe and a second detector for detecting the light light-modulated by the second probe.

The optical system may comprise a probe which can be arranged in the vicinity of two signal paths and has an electro-optical effect, a light source for supplying a light to the probe, an optical circuit for supplying the light of the light source to the vicinities of the two signal paths, and first and second detectors for detecting the lights light-modulated by the probe in the vicinities of the signal paths.

The second means may store the signal waveform in a digital form.

The second means may determine a correlation between the stored waveform to detect a time difference.

The second means may detect the time difference from a peak of correlation of the stored signal waveforms to detect the time difference.

The second means may Fourier-transform two stored signal waveforms and Fourier-reverse-transform a product of a conjunction function of one of the Fourier-transformed waveforms and the other waveform to determine correlation of the signal waveform.

The second means may Fourier-transform a digital form of the stored signal waveform by FFT by using a butterfly operation to determine a crossspectrum of the signal waveform and Fourier-reverse-transform the result to determine correlation of the signal waveforms.

The second means may store one of signals and measure another signal by the first means and process the signal waveforms to detect the time difference between the signals.

Third means for modifying the signal waveforms (for example, a low-pass filter, a digital filter, or a signal waveform filter) may further be provided.

The first means may comprise a pulse signal source for supplying pulse signals to pins of an IC to be measured, and apply signals through a number of channels corresponding to the pins connected to the pulse signal source, measure the signal waveforms, and adjust timings of the pulses to be supplied to the pins from the pulse signal source in accordance with the time difference detected by the second means.

In the time difference measuring system of the present invention, the signal waveform to be measured is measured by the first means, and the waveform is stored by the second means. The second means processes the stored signal waveform (determination of the time difference between the signals. For example, correlation) to detect a time relationship. By determining the time relationship from the correlation of the signals or a phase of a crossspectrum of the waveform, the time difference can be detected at a high accuracy which can not be attained by the comparison of the waveforms, even if a noise is included in the signal.

Where the first means includes an electro-optical crystal at the input of the signal, the measurement of higher accuracy is attained because it has a very high time resolution power.

Where the light light-modulated by the probe is reflected by the probe, an optical system may be constructed on one side of the signal path so that the probe may be moved to a position corresponding to the signal path. Thus, the timing relation can be easily measured at various points in the signal paths.

Where the third means is provided, a noise component may be eliminated by filtering the signal waveform so that components below a predetermined threshold are fixed.

Where the first means comprises the pulse signal source for supplying the pulse signals to the pins of the IC to be measured, the timing of the pulse signals to the pins of the IC can be adjusted so that the timings of the pulse signals to the IC to be measured are synchronized.

In accordance with the time difference measuring system of the present invention, since the signal waveform is processed by the second means to detect the time relationship, the time difference can be detected with a higher accuracy than that by the visual measurement of the waveform. In addition, depending on the processing method, the time relationship can be detected with a high accuracy even if a noise is included.

Where the first means is constructed by the electro-optical crystal for inputting the signal, the measurement with a higher accuracy is attained because it has a very high time resolution power.

Where the first means uses the pulse signal source for supplying the pulse signals to the pins of the IC under measurement, the timing change of the IC under measurement can be more accurately measured because the timings of the pulse signals to the IC under measurement can be aligned.

Where the third means is provided, a more accurate time relationship can be detected because the noise component is eliminated.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DETAILED DESCRIPTION OF THE DRAWINGS

Figure 1:
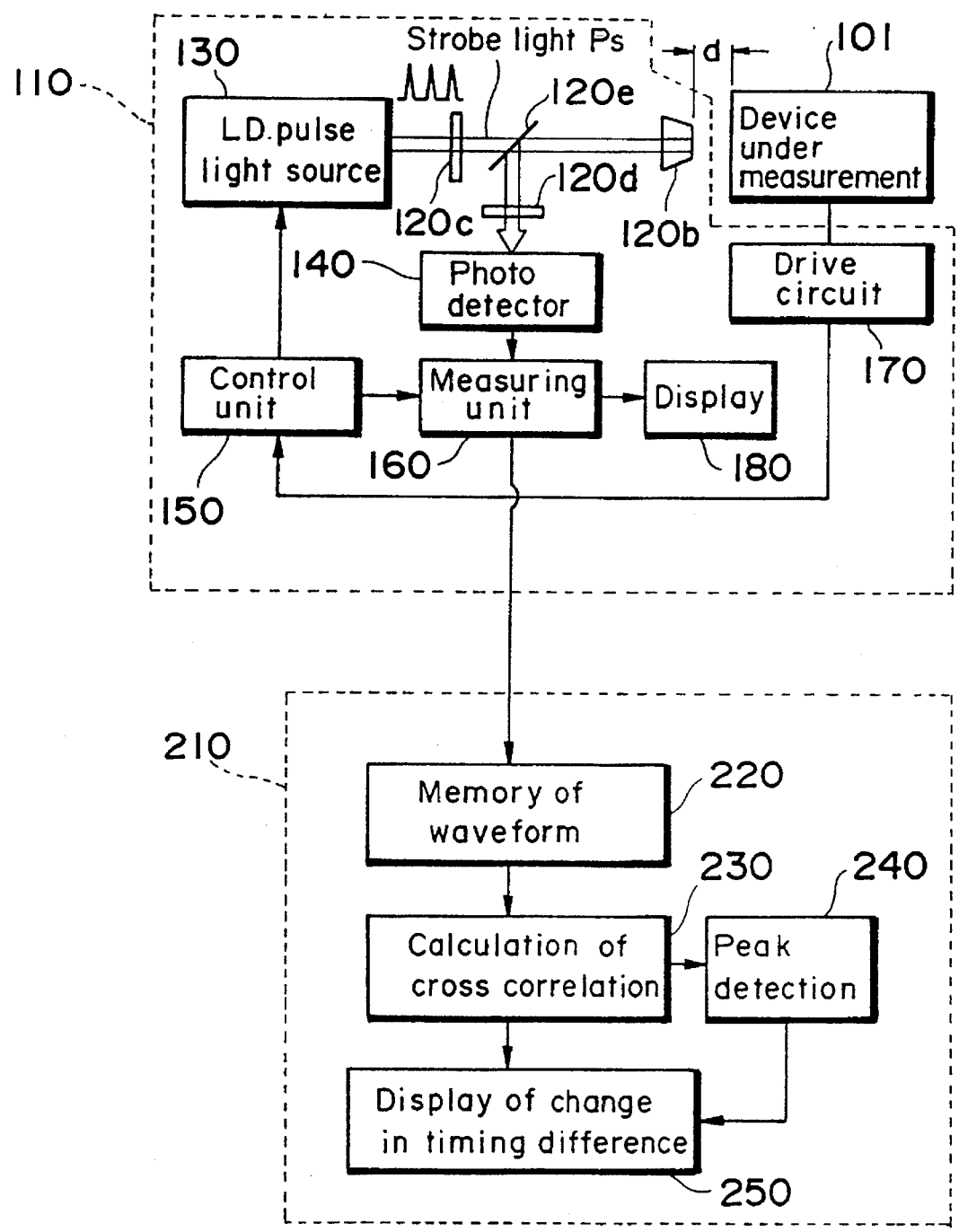
FIG. 1 Shows a configuration of one embodiment of the present invention.
Figure 8A:
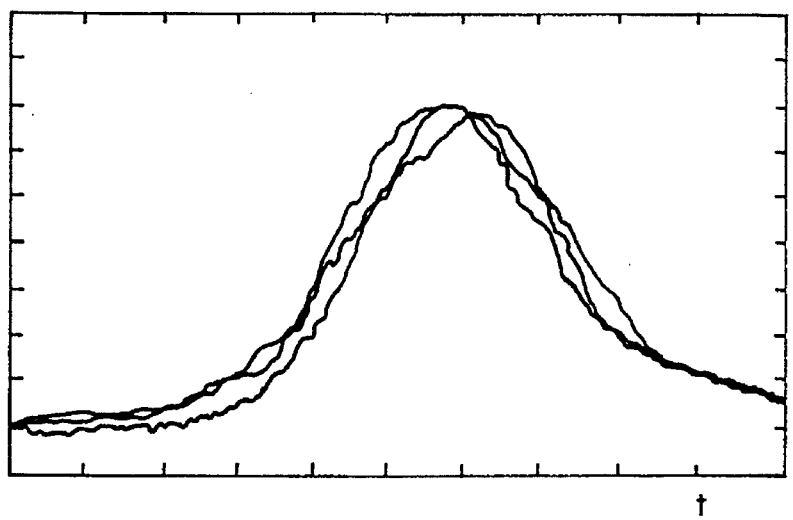
Figure 8B:
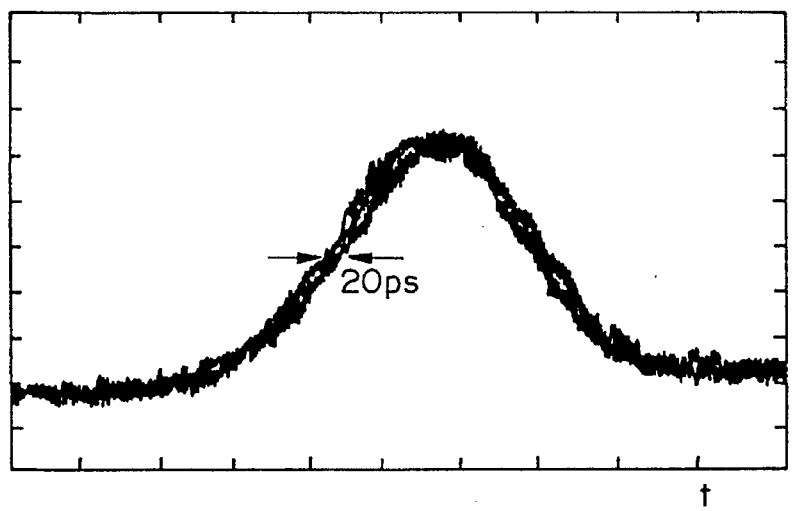
Figure 11:
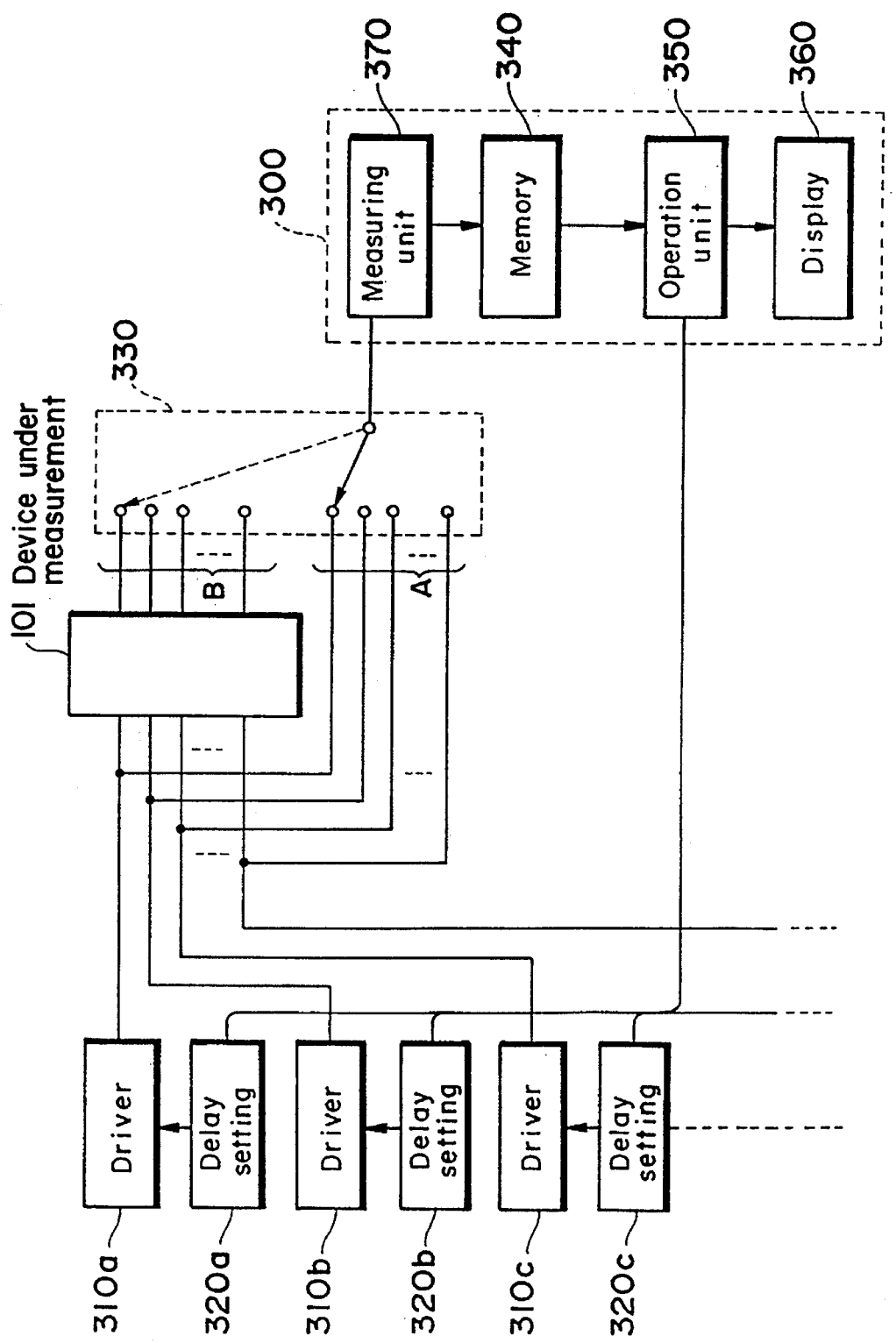
Figure 12:
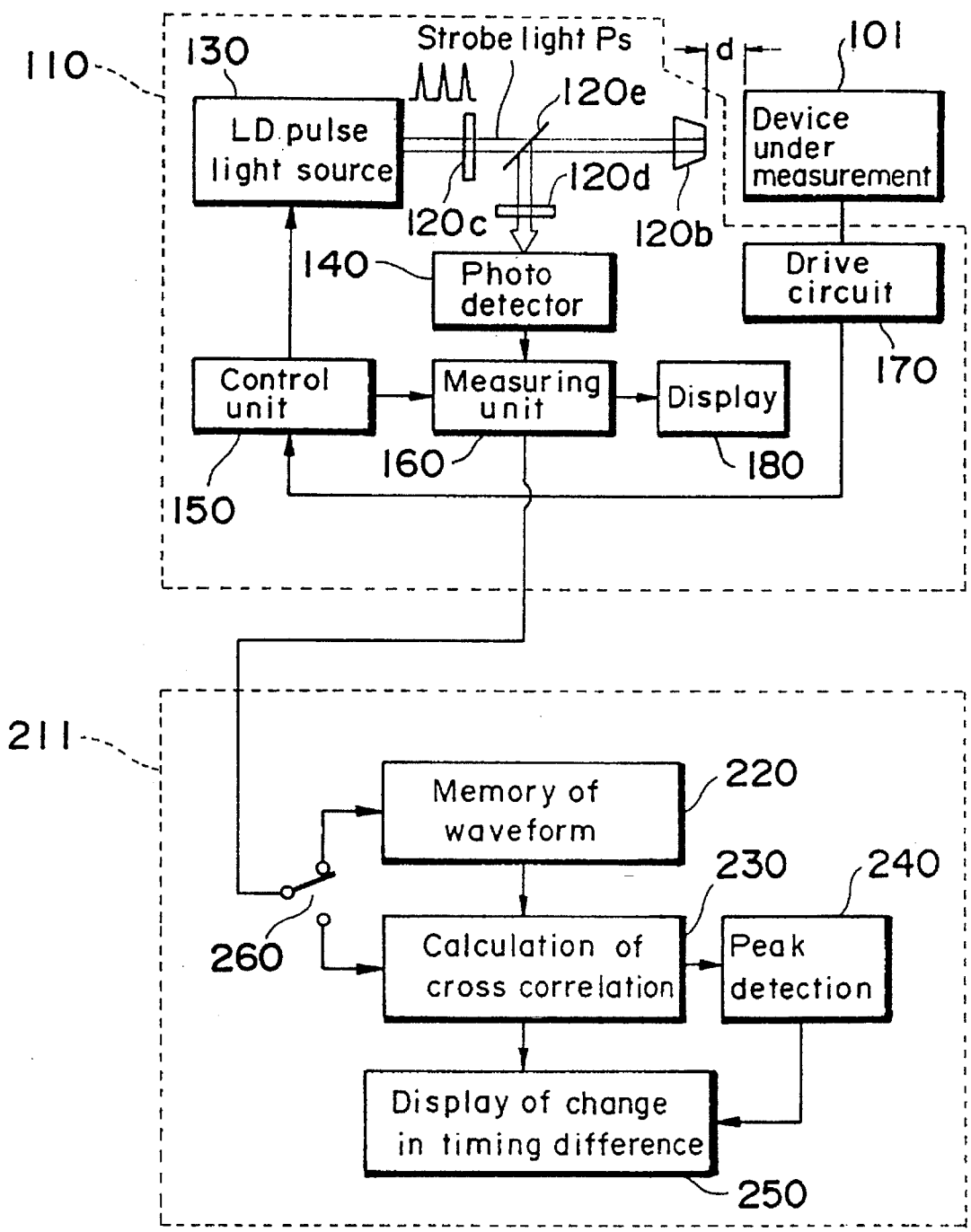
Figure 13:
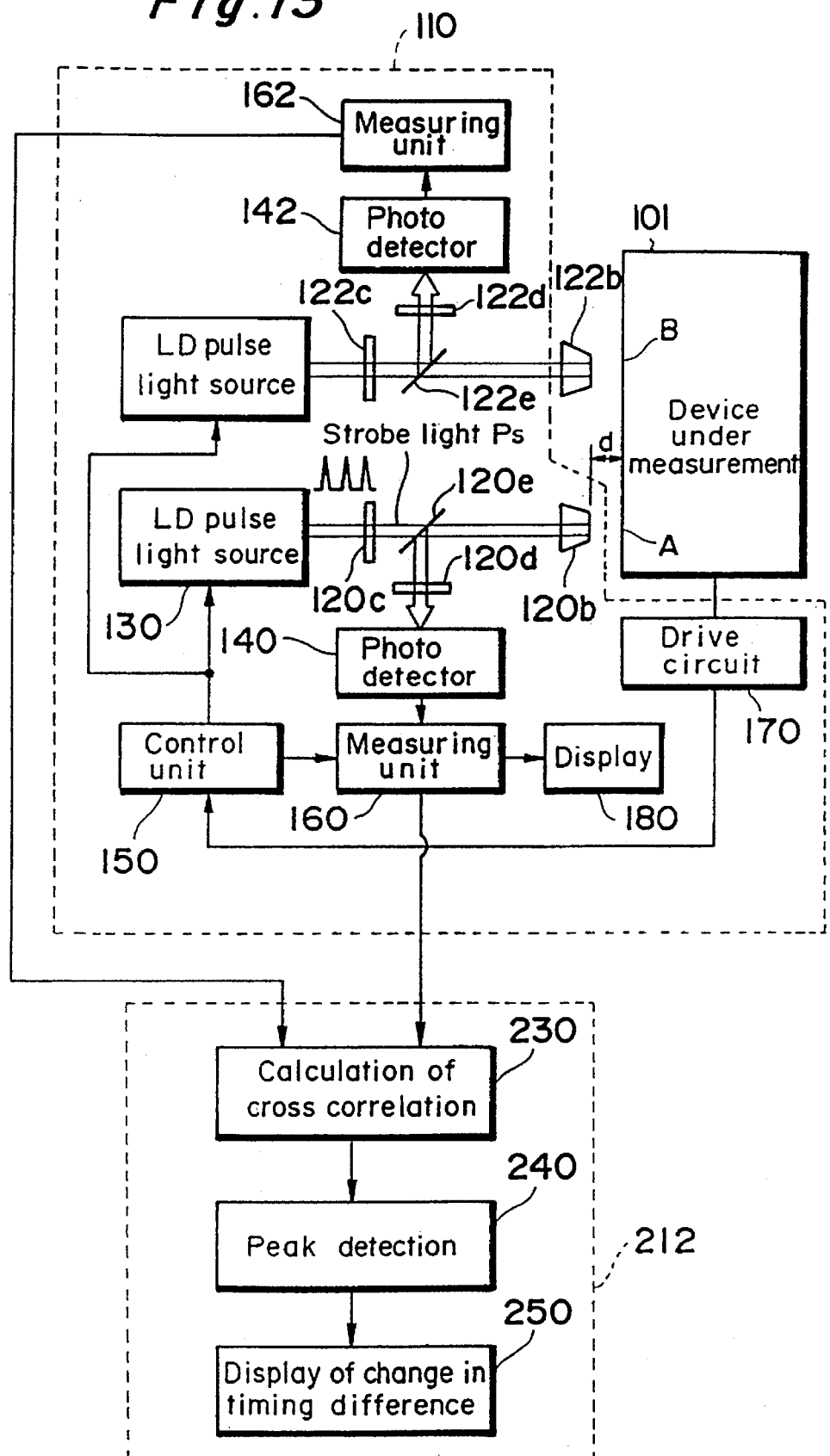
Figure 14:
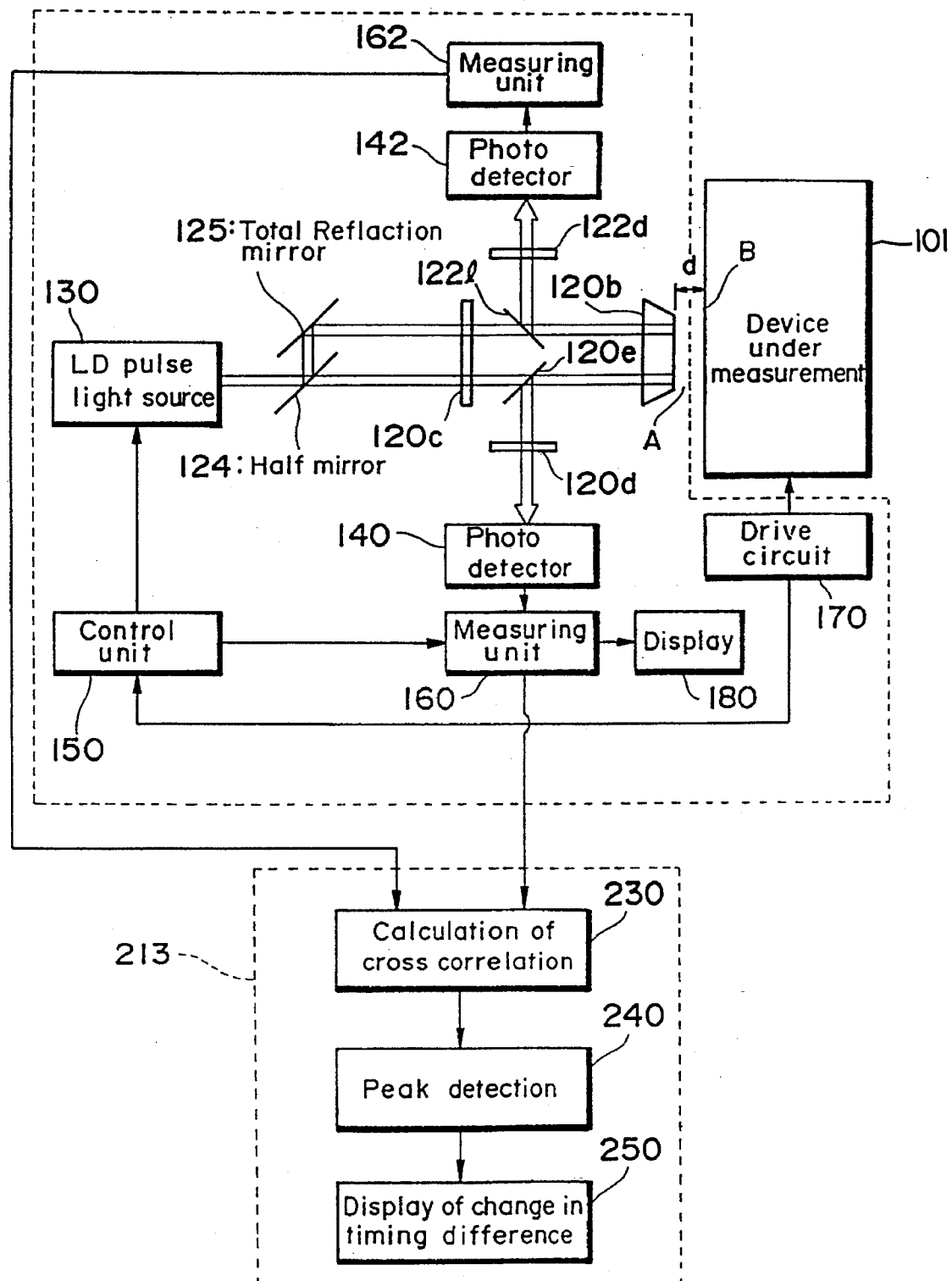

FIGS. 8A and 8B show a variance of the measurement output of the system of FIG. 1, FIG. 9 shows measurement of a gate delay characteristic of a semiconductor device, FIGS. 10A and 10B shows an example of input/output waveforms to and from the semiconductor device in the measurement of FIG. 9, FIG. 11 shows a conceptual view of an application to an IC tester, FIG. 12 shows a configuration of a second embodiment of the present invention, FIG. 13 shows a configuration of a third embodiment of the present invention, and FIG. 14 shows a configuration of a fourth embodiment of the present invention.

DETAILED DESCRIPTION OF THE PREFERRED EMBODIMENTS

An embodiment of the present invention is now explained with reference to the drawings. FIG. 1 shows a configuration of a first embodiment of the present invention. The present system comprises an E-O measuring unit 110 and a waveform store and processing unit 210.

The E-O measuring unit 110 is similar to a device shown in the reference titled as "Non-contact picosecond electro optics sampling with a Semiconductor Laser" of T.IEE Japan, Vol. III-C No. 4, '91, of which authors are the inventors of the present invention.

The E-O measuring unit 110 measures a signal waveform by sampling an electrical signal of a device 101 under measurement by a strobe light Ps and it exhibits a very high time resolution. This unit uses a laser diode as a light source to simplify the optical system and reduce the size of the unit.

Figure 2:
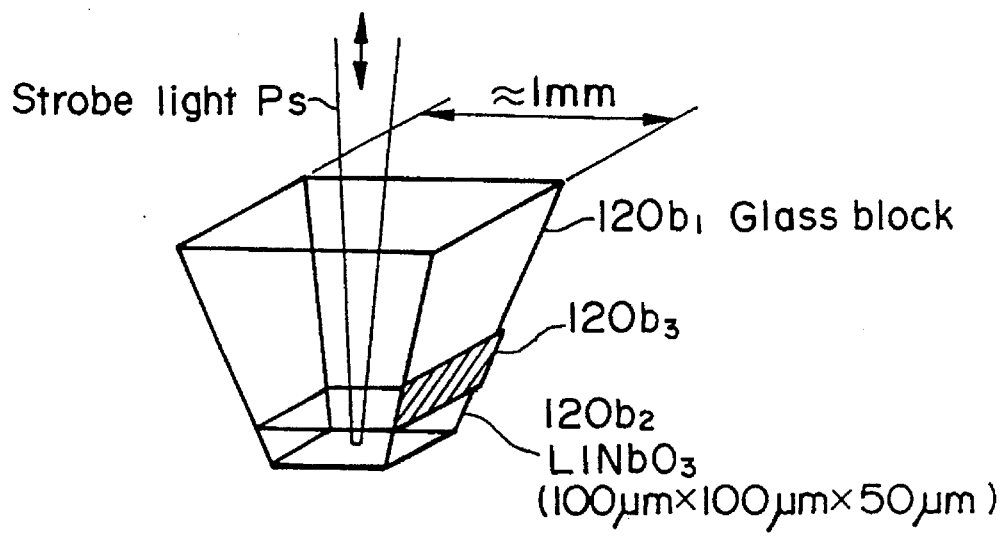
FIG. 2 shows a configuration of an E-O probe.

An optical system of the E-O measuring unit 110 comprises an LD pulse light source 130 which uses a laser diode, a polarizer 120c, an E-O probe 120b made of an electro-optical crystal, a half-mirror 120e, an analyzer 120d and an optical detector 140. As shown in FIG. 2, the E-O probe 120b detects an electrial field in vertical direction in the drawing and it comprises an electro-optical crystal (LiNbO$_3$, GaAs, ZnTe, Cdte, BSO) 120b$_2$ mounted on a glass block 120b$_1$. A dielectric multi-layer film for reflecting the strobe light Ps is coated on a bottom surface of the electro-optical crystal 120b$_2$. An ITO transparent electrode is mounted at the other end and a side electrode 120b$_3$ for applying a voltage to the transparent electrode is provided.

Figure 3:
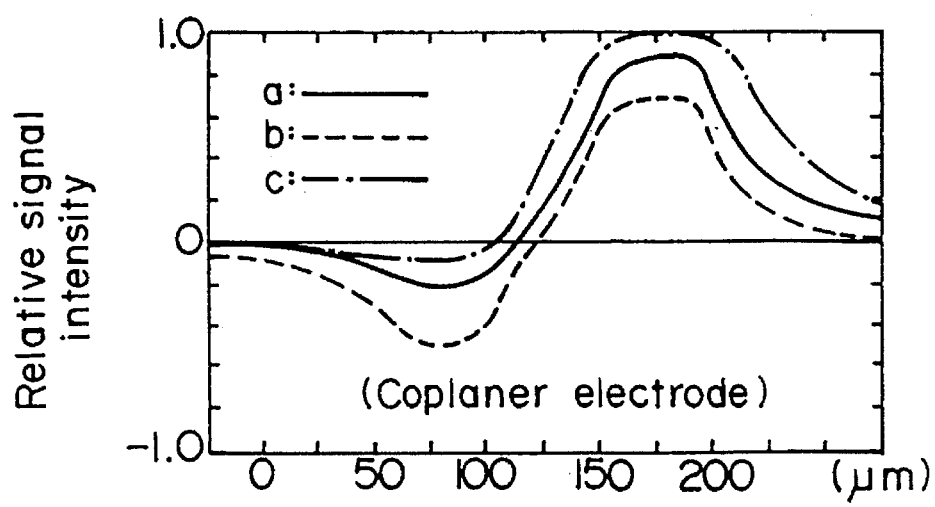
FIG. 3 shows a graph of a detection output of an E-O measuring unit.

An operation of the optical system of the E-O measuring unit 110 is briefly explained below. The strobe light Ps from the LD pulse light source 130 is directed to the E-O probe 120b and reflected back at on end thereof. The device 101 under measurement is arranged near the end of the E-O probe 120b. When a voltage is applied to the device 101 under measurement, a refractive index of the electro-optical crystal 120b$_2$ varies in accordance with the voltage so that a polarization status of the strobe light Ps changes. The strobe light Ps passes through the analyzer 120d and the change in the polarization status is detected as a change in the intensity of detected light (light modulation). FIG. 3 shows a change in the intensity of the detected light by position caused by the electrical field on the electrodes (ground electrode and signal electrode) on the device 101 under measurement.

Figure 4:
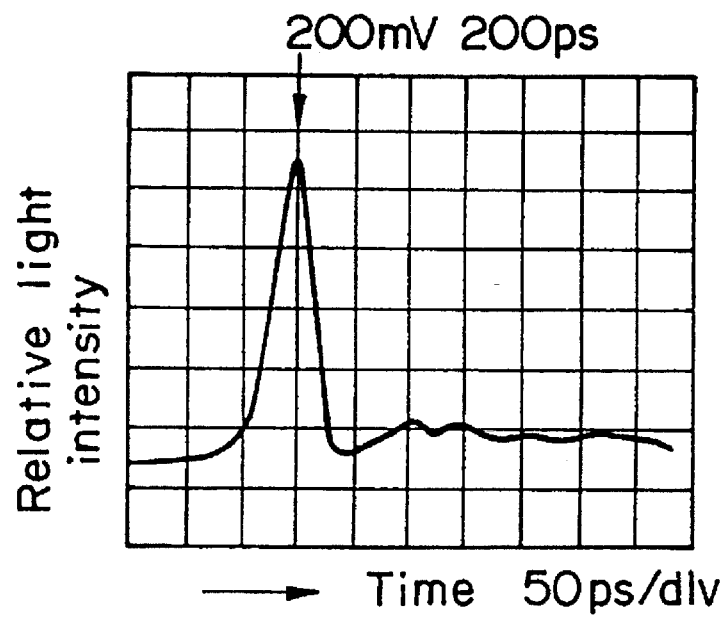
FIG. 4 shows a waveform of a drive pulse.
Figure 5:
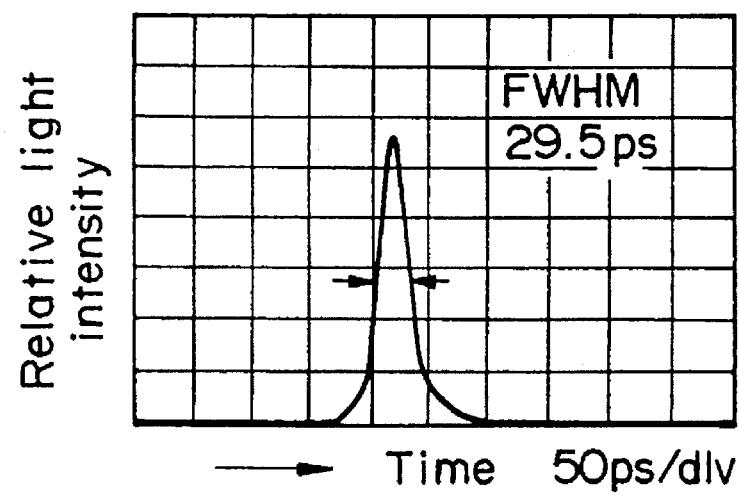
FIG. 5 shows a waveform of a strobe light.

The measurement-control unit of the E-O measuring unit 110 comprises a drive circuit 170, a control unit 150, a measuring unit 160 and a display unit 180. The drive circuit 170 supplies a pulse signal (drive pulse) to the device 101 under measurement. As an example, a COM generator (HP 33002A) may be used to supply a pulsed measuring signal as shown in FIG. 4. The control unit 150 causes the LD pulse light source 130 to emit the pulsive strobe light Ps as shown in FIG. 5 in accordance with the drive timing of the drive circuit 170, and supplies a reference signal to the measuring unit 160 in accordance with the output timimg of the strobe light Ps. The measuring unit 160 includes a lock-in amplifier and detects a waveform of an electrical signal by lock-in-amplifying it by the signal of the control unit 150.

Figure 6:
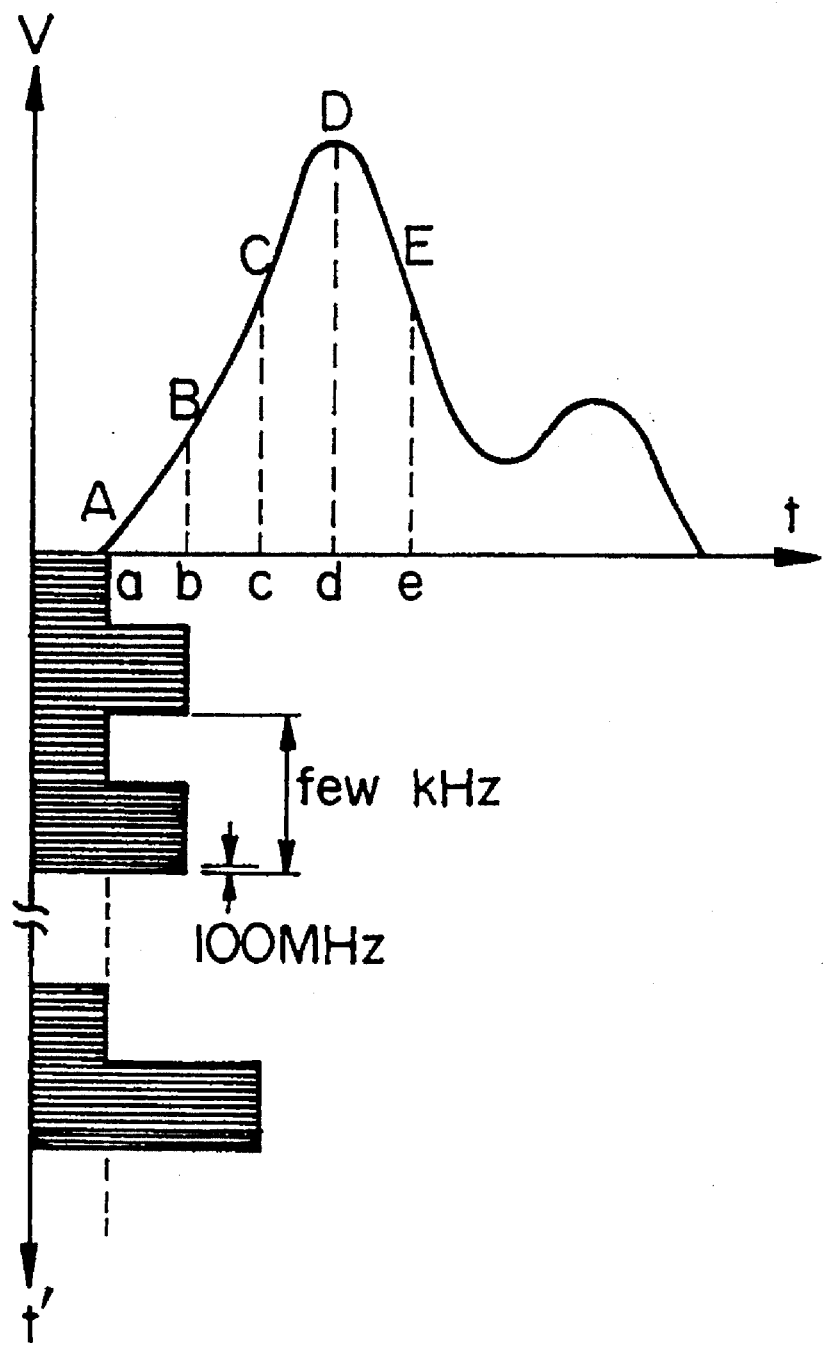
FIG. 6 shows a process of a measurement control unit of the E-O measuring unit.

An operation of the E-O measuring unit 110 is described below. Drive pulses are sequentially produced by the drive circuit 170. It is assumed that a waveform of an electrical signal of the device 101 under test for one of the drive pulses is one shown in a first quadrant in FIG. 6. The strobe light Ps is emitted with an offset of a predetermined timing from the drive pulse. The electrical signal of the device 101 under measurement is sampled by the optical system by the strobe light Ps and it is detected. The strobe light Ps is turned on at a position a of FIG. 6 for a predetermined duration, and turned off at a position b for a predetermined duration, and repeats the above cycle.

Then, it is turned on at a position c instead of the position a and the cycle is repeated. The position a is changed to positions c, d, e, and so on. The measuring unit 160 outputs voltages B, C, D, E, . . . with reference to a voltage A. In this manner, the waveform of the electrical signal of the device 101 under measurement is measured by the E-O measuring unit 110. Since the laser diode is used as the light source to electrically turn on the pulse, the turn-on timing is electrically controlled and an optical system for light delay is not necessary, which makes the optical system simpler. As for the electrical signal waveform measured by the E-O measuring unit 110, the time resolution power is in the order of a pulse width of the strobe light Ps.

The waveform store and processing unit 210 has a plurality of function parts, which comprise memory of waveform part 220, calculation part 230, peak detection part 240 and display timing change part 250. Specifically, it is constructed by a computer, a softwave thereof and a peripheral equipment such as an A/D converter. In the memory of waveform part 220, the electrical signal waveform measured by the E-O measuring unit 110 is converted and stored in a digital form. In the calculation of cross correlation part 230, the correlation of two electrical signal waveforms from the memory of waveform part 220 is calculated. In the peak detection part 240, a peak of the correlation calculated in the calculation of cross correlation part 230 is detected and a time at the peak is taken as a timing relationship between the signals. In the display part 250, the outputs of the calculation of cross correlation part 230 and the peak detection part 240 are displayed.

The calculation of the correlation is explained below. Assuming that the two electrical signal waveforms stored in the waveform memory 220 are represented by f(t) and g(t), a correlation I(τ) thereof is given by $$I(\tau) = \int_{-\infty}^{\infty} f(t) g(t+\tau) dt \tag{1}$$

Assuming that f(t) and g(t) are identical in the waveform and shifted from each other by a time to, $$g(t)=f(t+t_0)$$

Then, the correlation I(τ) is given by $$I(\tau) = \int_{-\infty}^{\infty} f(t) f(t + to + \tau) dt \tag{2}$$

It represents a self-correlation of f(t) and it is maximum (peak) when $t_0+\tau=0$, that is, $t_0=-\tau$. Accordingly, by determining t which makes the correlation I(τ) maximum, a change in time $t_0$ is determined.

The correlation I(τ) may be calculated by the algorithm of the formula (2) or it may be modified by utilizing a Fourier transform as shown below. When it is processed by the algorithm of the formula (3), a higher speed calculation is attained.

$$I(\tau)=F^{-1}[F(w)^* \cdot G(w)] \tag{3}$$

wherein,

F(w), G(w) are respectively Fourier transforms of f(t) and g(t);

$F^{-1}$ [ ] shows Fourier reverse transform;

F(w)$^+$ is a function of complex conjugate variable in F(w); and

F(w)*, G(w) in a cross-spectral.

As the algorithm for high speed Fourier transform, an FFT which uses a butterfly operation is widely known. In the present embodiment, it is used to determine a crosspectrum and it is Fourier-reverse-transformed to determine the correlation I(τ).

The change in time to may be determined directly from a phase of the crossspectrum which is a complex number.

The measurement of a time relationship by the present system is now explained.

Figure 7A:
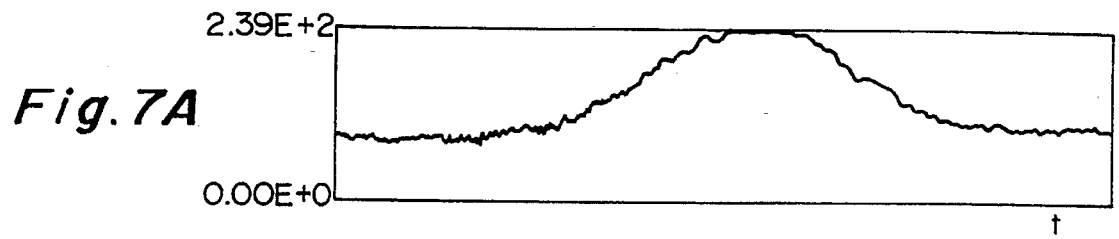
FIGS. 7A–7C show an example of a measurement output of the system of FIG. 1.
Figure 7B:
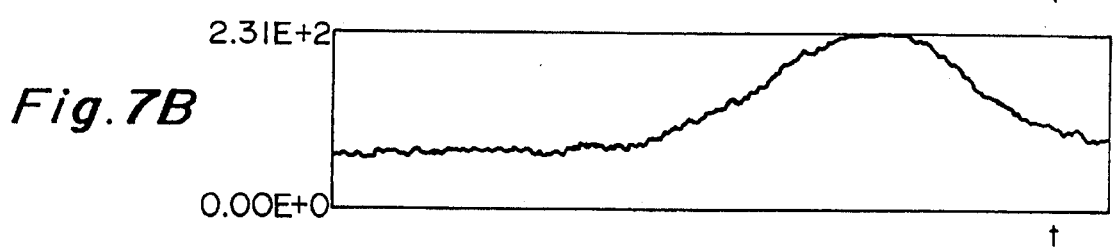

A drive pulse to the device 101 under measurement has a peak voltage of 1 volt and a half-value width of 150 ps, and a microstrip line is used for the device 101 under measurement. A variable length waveguide, not shown, is provided between the drive circuit 170 and the device 101 under measurement to delay the drive pulse to impart a quasi-change in time of the drive pulse. FIG. 7A shows an output waveform of the E-O measuring unit 110 when the delay of the variable length waveguide is zero. FIG. 7B shows an output waveform when a delay is given. A full scale in the drawing is 1024 channels which corresponds to 550 ps. By the comparison of those waveforms, it is readily seen that there is a change in time because of the shift in the output waveforms but it is difficult to accurately determine the extent of change, because the output waveform includes a noise which hides a real waveform.

Figure 7C:
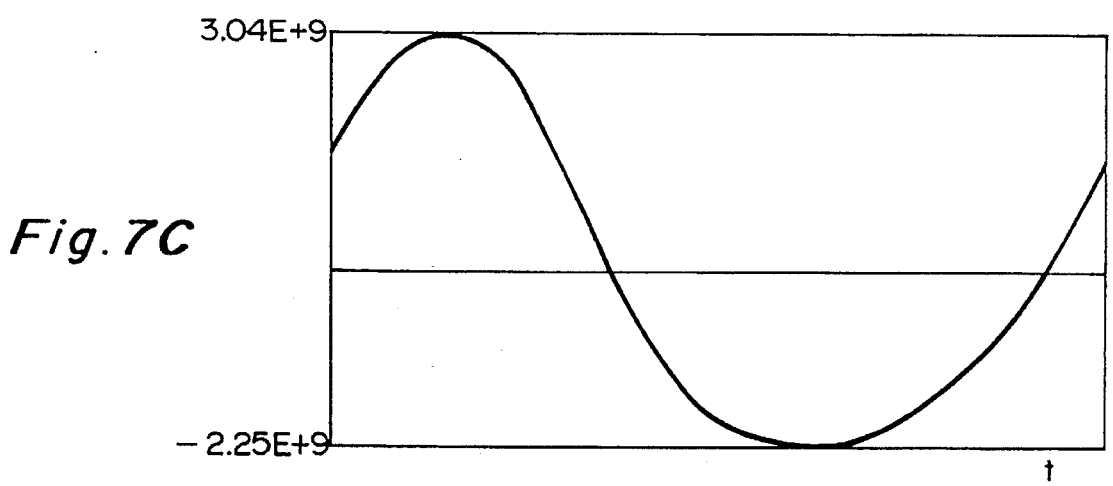

FIG. 7C shows an output of a correlation of the waveforms of FIG. 7A and 7B by the waveform store and processing unit 210. The waveform has a peak at 155 channels. The time 83.3 ps which corresponds to the peak shows a change in time. The waveforms in FIGS. 7A and 7B include noises but the waveform of FIG. 7C devided from those waveforms includes a very few noise, which is to be noticed. It is considered that the elimination of the noise is due to the averaging of noises of the waveform by the calculation of the correlation. As a result, the peak of the correlation can be determined with a high accuracy. Thus, the change in time can be determined with a high accuracy.

In order to evaluate the measurement accuracy, a variance of the measurement results was measured. The measurement was done a plurality of times with a fixed delay of the variable length waveguide. The output waveform of the E-O measuring device 110 varies from measurement to measurement. FIG. 8A shows results of three times measurement. As the number of times of measurement increases, it has a certain width as shown in FIG. 8B (nine times measurement in FIG. 8B). The measurement limit is larger than that width if the output waveforms of the E-O measuring unit 110 are simply compared. A standard deviation a of the changes in time determined by the correlation based on those output waveform was 2.8 ps. A range 4σ in which 95% of data come is 11.2 ps, which shows a significant improvement of the accuracy. In the optical system of the E-O measuring unit 110, the pulse width of the LD pulse light source 130 is 30 ps but the unit of the present embodiment can measure the change in time with a higher accuracy.

Since the system of the present embodiment can measure the change in time of the high speed electrical signal waveform with a high accuracy, it may be applied in various ways. For example, it may be applied to the measurement of a propagation characteristic (velocity, attenuation and distortion) on an RF transmission line, timing correction of waveforms from a plurality of signal sources or the measurement of a gate delay characteristic of a semiconductor such as a transistor. In such applications, the time relationship of electrical signals is measured with different objects under measurement or different settings.

FIG. 9 shows an application to the measurement of the gate delay characteristic of the semiconductor device such as a transistor. Usually, the output levels and the waveforms are, in many cases, not identical between an input terminal and an output terminal of the gate. In such a case, the delay can not be determined by simple comparison of the waveforms. For example, FIG. 10A shows an input signal waveform and FIG. 10B shows an output waveform. In the unit of the present embodiment, since the peak of the correlation of those waveforms is measured, the change in time can be measured even with such a distored waveform. It means that the delay characteristic may be measured for not only a digital device but also an analog device.

The reason why even the distorted waveform is measurable is described below. The formula (1) is divided into an input signal component (real signal component) and a distortion component. It is considered that the distortion component is very small by the averaging as is the noise component described above. Accordingly, since the distortion component is expressed by a progression sum of harmonics of the real signal component, more accurate change in time can be measured by passing it through a filter before a correlation is calculated. In order to construct the filter, a low pass filter may be provided at an output of the E-O measuring unit 110 or a digital filter may be provided in the waveform store and processing unit 210. Those may be implemented by known methods and the description of detail is omitted.

Alternatively, a correlation may be calculated for those waveforms of the E-O measuring unit 110 which are below a predetermined threshold by using a comparator so that the time difference can be measured with a high accuracy. For example, an overshoot and an undershoot occur in the waveform of FIG. 10B but they may be eliminated if they are below the predetermined threshold. In this case, a comparator may be provided at the output of the E-O measuring unit 110 or data may be processed in the waveform store and processing unit 210.

An IC tester is an examples of application of two measurements, the calibration for timing adjustment of the waveforms from a plurality of signal sources and the measurement of the gate delay characteristic described above.

The IC tester has terminals corresponding to pins of the IC and the number thereof amounts to 512 at maximum. It is necessary to supply drive pulses of a synchronized timing to those pins, but because of differences in wiring lengths of cables, socket boards and IC sockets and physical arrangements, the delay times and the stray capacitances are different from each other and the timings of the drive pulses at the respective pins of the IC are not identical. This is a cause of an error in the measurement of the gate delay characteristic and the skew measurement of a logic. FIG. 11 shows a conceptual view of one proposal for the application to the timing calculation and the timing correction of the IC tester.

In the present system, numeral 300 denotes a portion which corresopnds to the system of FIG. 1 and comprises a measuring unit 370 for measuring a signal waveform of an input signal, a memory 340 for storing the measured signal in a digital form, an operation unit 350 for calculating a correlation from the digital signal stored in the memory 340, and a display unit 360 for displaying the correlation output. A voltage detected by the measuring device 370 is switched by a switch 330. An output from the operation unit 350 is connected to delay setting circuits 320a, 320b, 320c, etc. so that the delay times of the corresponding drivers 310a, 310b, 310c, etc. are variable. The measurement of the gate delay characteristic by the present unit is described below.

At the timing calibration of the drive pulses, the switch 330 is positioned at the top on the side A and the drive pulse is supplied from the driver 310a. A waveform of the drive pulse in the vicinity of the pin of the device 101 under measurement is measured by the measuring unit 370 and read into the memory 340. Then, the switch 330 is positioned at a second from the top on the side A, and the waveform of the drive pulse is similarly read. Then, a timing relationship between the firstly read waveform and the secondly read waveform is detected by the operation unit 350. The delay setting circuit 320b is adjusted in accordance with the detected time difference to align the drive pulse from the driver 310b to that from the driver 310a. The switch 330 is then switched to a third position from the top and subsequent positions in sequence and the drive pulses are aligned to the first one in a similar manner.

In the measurement of the gate delay characteristic, drive pulses of a synchronized timing are applied to the device 101 under measurement from the drivers 310a, 310b, 310c, etc., the switch 330 is sequentially positioned to a top position to subsequent positions on the side B, and the waveforms of the output pins of the device 101 under measurement are sequentially read to measure the gate delay characteristic. In this manner, the delay time can be accurately measured not only for the digital IC but also for the analog IC.

FIG. 12 shows a configuration of a second embodiment. The like elements to those of FIG. 1 are designated by the like numerals, and the E-O measuring unit 110 is identical. The waveform store and processing unit 211 is basically identical but a switch function part 260 is provided so that the electrical signal waveform measured by the E-O measuring unit 110 is stored in a digital form to be able to compare with the later measured waveform.

Firstly, the switch function part 260 is set to first function position to guide a signal from the unit 110 to the memory of waveform part 220 so that the wavefrom is stored. As it is in the embodiment of FIG. 1, the waveform of the electrical signal from the device 101 is measured by the E-O measurement unit 110 and the measured waveform is stored in the memory of waveform part 220. Next, the switch function part 260 is set to second function position so that an cross correlation calculation is performed in the calculation of cross correlation part 230. A setting may be changed from that for the previous electrical signal waveform, a measurement position may be changed from the gate input of the device 101 under measurement to the gate output, or an object to be measured may be changed. Similarly, the electrical signal waveform is measured by the E-O measuring unit 110 and a correlation of the two electrical signal waveforms is calculated from the electrical signal waveform from the E-O measuring unit 110 and the previously stored waveform. A peak of the correlation is detected by the peak detector 240 and the time difference is displayed by the timing change display unit 250.

Since it is not necessary to store two waveforms, the memory capacity may be small and the peak may be detected at a faster speed.

FIG. 13 shows a configuration of a third embodiment. The present embodiment is provided with two channels of optical system of the E-O measuring unit 110 to allow the simultaneous measurement of the electrical signal waveforms of the device 101 under measurement at different points. The like elements to those shown in FIG. 1 are designated by the like numerals.

One of the optical systems of the E-O measuring unit 110 is identical to that of FIG. 1 and it detects an electrical field of a measurement point A. An equivalent optical system (an LD pulse light source 130, a polarizer 122c, an E-O probe 122b made of an electro-optical crystal, a half-mirror 122e, an analyzer 122d and an optical detector 142) is provided to detect the electrical field at the measurement point B. The LD pulse light source 132 is driven in parallel with the LD pulse light source 130 and produces a pulse light of the same waveform. A measuring unit 162 is also identical to the measuring unit 160 and it detects an electrical signal waveform at a measurement point B by lock-in amplifying it. The optical systems at the measurement points A and B are independently displaceable on the device 101 under measurement.

A waveform store and processing unit 212 is basically identical but an A/D converter is additionally provided as an interface to permit simultaneous inputting of the measuring unit 160 and the measuring unit 162. In the calculation of cross correlation part 230 calculates a correlation of the electrical signal waveforms at the measurement points A and B from the measuring unit 160 and the measuring unit 162 are tempolarily stored and there often the cross correlation is performed.

The optical systems are first positioned at the measurement points A and B of the device 101 under measurement. The electrical signal waveforms at the measurement points A and B are detected by the E-O measuring unit 110 in the same manner as that in the embodiment of FIG. 1 and a time difference between those waveforms is measured by the correlation by the waveform store and processing unit 210. In this manner, two waveforms can be simultaneously measured and the time difference can be measured with less shift and more quickly than those of FIG. 1.

FIG. 14 shows a configuration of a fourth embodiment. The present embodiment is also provided with two channels of optical system of the E-O measuring unit 110 and it is characterized by a simplified construction of the optical system. The present embodiment also allows the simultaneous measurement of electrical signal waveforms of the device 101 under measurement at different points. Again, the like elements to those shown in FIG. 1 are designated by the like numerals.

In the optical system of the present E-O measuring unit 110, the LD pulse light source 130, the polarizer 120c and the E-O probe 120b made of electro-optical crystal are shared and the optical system at the measurement point A is constructed by the LD pulse light source 130, the polarizer 120c, the E-O probe 120b made of the electro-optical crystal, the half-mirror 120e, the analyzer 120d and the optical detector 140. The light of the LD pulse light source 130 is branched by the half-mirror 124, and one of them is directed to the optical system at the measurement point A while the other is directed to the optical system at the measurement point B. The optical system at the measurement point B comprises the LD pulse light source 130, a total reflection mirror 125, the polarizer 120c, an E-O probe 122b made of an electro-optical crystal, the the half-mirror 122l, the analyzer 122d and the photo detector 142. The waveform store and processing unit 213 is basically identical to those described above. The correlation calcultion unit 230 calculates a correlation of the electrical signal waveforms at the measurement points A and B from the measuring unit 160 and the measuring unit 162. A time difference is measured in the same manner as that of FIG. 13.

In the present embodiment, since the E-O probe 120b is shared, the flexibility to the setting of the measurement points A and B is inferior to that of FIG. 13 but the number of optical parts is reduced.

The present invention is not limited to the above embodiments but various modifications thereof may be made.

For example, the waveform store and processing unit 210 need not be a computer but it may be a recently developed DSP (digital signal processor) and a memory device. In the measurement by the IC tester, the switch 330 is switched starting from the top position on the side A in the above embodiment although the sequence of switching may be different. In FIG. 11, the E-O measurement unit 110 of FIG. 1 may be used. In this case, since the optical system of the E-O measuring unit 110 is compact and may be integrally manufactured, the optical system of the E-O measuring unit 110 may be driven by an actuator for inputting to the E-O measuring unit 110.

Where the waveforms to be measured are complementary, the calculation of the correlation is linear and the waveform of FIG. 7(c) is a complementary one. In such a case, a value which makes a minimum is used as the time difference.

Although in the above embodiment, the E-O measurement unit 110 measures a signal waveform by sampling with a strobe light from the pulse light source, the unit and method, in the present invention, is not limited to be the above. Concretely, a CW light power source may be used as a light power source and non-sampling method using a high speed photo detector may be used. In the case, the time resolusion in the E-O measurement unit is limited by the capability of the photo detector and the measurement unit. When a high speed pin-PD or APD is used as the photo detector and a high speed digital oscilloscope is used as the measurement unit, signals of the wave band over 1 GH can be measured. In the case, it is seen in the above embodiment, the timing relationship between signals are measured with high accuracy by using a waveform memory calculator.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A system for measuring a timing relationship between at least two signals comprising:

first means for measuring waveforms of said at least two signals; and second means for storing said signals and establishing a reference point for said signals and processing said stored signals to detect a time difference between said signals;

wherein said first means includes an optical system for converting an electrical field of each of said signals to a light signal by light modulation for detecting said signal, and a measuring system for measuring said waveform of each of said signals based upon said electrical field of the signal detected by said first means.

2. A system according to claim 1 wherein said second means stores one of said at least two signals and then said first means measures another signal, and said second means processes the signal waveforms to determine the time difference of the signals.

3. A system according to claim 1 wherein said second means calculates a correlation of the stored signal waveforms and detects the time difference from the correlation.

4. A system according to claim 3 wherein said second means Fourier-Transforms the two stored signal waveforms, Fourier-reverse-transforms a product of a conjugation function of one of the Fourier transformed waveforms with the other to determine the correlation of the signal waveforms.

5. A system according to claim 1 wherein said optical system is a two-channel system.

6. A system according to claim 5 wherein said optical system includes a first probe disposable in a vicinity of a first signal path and having an electro-optical effect, a first light source for supplying a light to said first probe, a first detector for detecting the light light-modulated by said first probe, a second probe disposable in a vicinity of a second signal path and having an electro-optical effect, a second light source for supplying a light to said second probe, and a second detector for detecting the light light-modulated by said second probe.

7. A system according to a claim 5 wherein said optical system includes a probe disposable in a vicinity of first and second signal paths and having an electro-optical effect, a light source for supplying a light to said probe, an optical circuit for directing the light from said light source into vicinity of said first and second paths of said probe, and first and second detectors for detecting the light light-modulated by said probe in the vicinity of each of the first and second signal paths.

8. A system according to claim 1 wherein said optical system includes a probe disposable in a vicinity of a path of the signal and having an electro-optical effect, a light source for supplying a light to said probe, and a detector for detecting the light light-modulated by said probe.

9. A system according to claim 8 wherein the light light-modulated by said probe is reflected by a reflection film formed on a bottom surface of said probe and detected by said detector.

10. A system according to claim 8 wherein said light source is a laser light source having a short pulse laser beam output.

11. A system according to claim 8 wherein said measuring system includes a control circuit for driving said light source to produce a pulsed light beam, and a measuring unit for detecting said waveform by lock-in amplification of output of said detector, based upon drive timing of said control circuit.

12. A system according to claim 11 wherein said measuring system further includes a drive circuit for supplying a driving signal to a circuit under measurement including a signal path, and said control circuit drives said light source with a gradually offset timing as compared to timing of a pulse supplied by said drive circuit.

13. A system according to claim 1, wherein said optical system includes:

probe means having a first probe comprising an electro-optic material having an optical characteristic which is changeable by an electric field of a sample;

a light source for emitting light to said probe means;

detecting means including a first photodetector which detects reflected light from said first probe, said reflected light being modulated by said first probe, said detecting means outputting a first electric signal and a second electric signal, wherein said second means includes:

a processing unit which stores data based on said first and second electric signals, said processing unit calculating a time difference between said first and second electric signals output from said detecting means by using said data.

14. A system according to claim 13, wherein said first probe includes a reflection film formed on a bottom surface thereof for reflecting light to said detector.

15. A system according to claim 13, wherein said light source is a laser having a short, pulsed output.

16. A system according to claim 13, wherein said probe means further comprises a second probe comprising an electro-optic material having an optical characteristic changeable by an electric field of said sample;

wherein said detecting means further comprises a second photodetector for detecting reflected light modulated by said second probe; and wherein said first photodetector outputs said first electric signal to said processing unit, and said second photodetector outputs said second electric signal to said processing unit.

17. A system according to claim 13, wherein said detecting means further comprises a second photodetector for detecting reflected light from said first probe;

wherein said first detector outputs said first electric signal to said processing unit; and wherein said second detector outputs said second electric signal to said processing unit.

18. A system according to claim 13, wherein said processing unit calculates a cross-correlation of said first electric signal and second electric signal to detect the time difference from the cross-correlation.

19. A system according to claim 13, further comprising:
a drive circuit for supplying a signal to said sample;
a control circuit for driving said light source to produce pulsed light, said control circuit being connected to said light source and said drive circuit; and
a measuring unit for detecting a first waveform of said first electric signal and a second waveform of said second electric signal by lock-in amplification of the output of said detecting means, wherein said processing unit calculates a cross-correlation of said first waveform and said second waveform by using the stored data and detects the time difference from the cross-correlation.

20. A system according to claim 13, further comprising:
a drive circuit for supplying a signal to said sample;
a control circuit for driving said light source to produce pulsed light, said control circuit being connected to said light source and said drive circuit; and
a measuring unit for detecting a first waveform of said first electric signal and a second waveform of said second electric signal by lock-in amplification of the output of said detecting means, wherein said processing unit Fourier-transforms said first and second waveforms, wherein said processing unit Fourier-reverse-transforms a product of a conjugation function of the Fourier-transformed first waveform and the Fourier-transformed second waveform to determine a cross-correlation of the first and second waveforms, and wherein said processing unit detects the time difference from the cross-correlation.

21. A system according to claim 13, further comprising:
a drive circuit for supplying a signal to said sample;
a control circuit for driving said light source to produce pulsed light, said control circuit being connected to said light source and said drive circuit; and
a measuring unit for detecting a first waveform of said first electric signal and a second waveform of said second electric signal by lock-in amplification of the output of said detecting means, wherein said processing unit calculates a cross-correlation of said first waveform and said second waveform by using the stored data to detect the time difference from the cross-correlation, wherein said calculation of the cross-correlation conforms to the following condition, $I = F^{-1} \{F(w)^* \times G(w)\}$, where t is time;

I is a function of the correlation;

f(t) represents a function of the first waveform;

g(t) represents a function of the second waveform;

$F(w)$ is a Fourier transform of f(t);

$G(w)$ is a Fourier transform of g(t);

$F^{-1}$ shows a Fourier reverse transform; and $F(w)^*$ is a function of a complex conjugate variable in $F(w)$.

22. A system according to claim 13, wherein said processing unit stores said first electric signal before said first photodetector outputs said second electric signal to said processing unit.

23. A system according to claim 13, wherein said processing unit modifies said first and second electric signals by filtering the first and second electric signals.

24. A system according to claim 13, further comprising:
a control circuit for driving said light source to produce pulsed light; and
a measuring unit for detecting waveforms of said first and second electric signals by lock-in amplification of the outputs of said detecting means.

25. A system according to claim 24, further comprising a drive circuit for supplying a drive signal to said sample, wherein said control circuit drives said light source with a timing gradually offset compared to timing of the drive signal supplied by said drive circuit.

26. A system for measuring a timing relationship between at least two signals comprising:
first means for measuring waveforms of said at least two signals; and
second means for storing said signals and establishing a reference point for said signals and processing said stored signals to detect a time difference between said signals;
wherein said first means includes a pulse signal source for supplying pulse signals to pins of an IC under measurement, a plurality of channels for receiving said at least two signals with a number of said channels corresponding to the pins connected to said pulse signal source, means for measuring said at least two signals, and means for adjusting timing of the pulses supplied from said pulse signal source to said pins in accordance with the time difference detected by said second means.

* * * * *